(12) United States Patent
Branchevsky et al.

(10) Patent No.: US 12,058,806 B2
(45) Date of Patent: Aug. 6, 2024

(54) DEVICES AND METHODS RELATED TO METALLIZATION OF CERAMIC SUBSTRATES FOR SHIELDING APPLICATIONS

(71) Applicant: SKYWORKS SOLUTIONS, INC., Irvine, CA (US)

(72) Inventors: Shaul Branchevsky, Mission Viejo, CA (US); Howard E. Chen, Anaheim, CA (US); Anthony James Lobianco, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 161 days.

(21) Appl. No.: 17/692,486

(22) Filed: Mar. 11, 2022

(65) Prior Publication Data

US 2022/0338342 A1 Oct. 20, 2022

Related U.S. Application Data

(60) Continuation of application No. 16/940,075, filed on Jul. 27, 2020, now Pat. No. 11,277,901, which is a
(Continued)

(51) Int. Cl.
*H05K 1/02* (2006.01)
*H01L 23/00* (2006.01)
(Continued)

(52) U.S. Cl.
CPC ........... *H05K 1/0216* (2013.01); *H01L 23/06* (2013.01); *H01L 23/552* (2013.01); *H01L 24/94* (2013.01);
(Continued)

(58) Field of Classification Search
CPC .. H05K 1/0215; H05K 1/0216; H05K 1/0218; H05K 1/0231; H05K 1/0298;
(Continued)

(56) References Cited

U.S. PATENT DOCUMENTS 4,695,858 A * 9/1987 Takezawa ............... H01L 31/12
257/680
4,790,894 A * 12/1988 Homma ............... H05K 3/3442
29/423
(Continued)

FOREIGN PATENT DOCUMENTS

CN 1592966 3/2005
CN 1856878 11/2006
(Continued)

*Primary Examiner* — Xiaoliang Chen
(74) *Attorney, Agent, or Firm* — Chang & Hale LLP

(57) ABSTRACT

Devices and methods related to metallization of ceramic substrates for shielding applications. In some embodiments, a ceramic assembly includes a plurality of layers, the assembly including a boundary between a first region and a second region, the assembly further including a selected layer having a plurality of conductive features along the boundary, each conductive feature extending into the first region and the second region such that when the first region and the second region are separated to form their respective side walls, each side wall includes exposed portions of the conductive features capable of forming electrical connection with a conductive shielding layer.

8 Claims, 13 Drawing Sheets

Related U.S. Application Data division of application No. 14/839,975, filed on Aug. 29, 2015, now Pat. No. 10,729,001.

(60) Provisional application No. 62/044,301, filed on Aug. 31, 2014.

(51) Int. Cl.
| | |
|---|---|
| *H01L 23/06* | (2006.01) |
| *H01L 23/15* | (2006.01) |
| *H01L 23/29* | (2006.01) |
| *H01L 23/50* | (2006.01) |
| *H01L 23/552* | (2006.01) |
| *H01L 23/60* | (2006.01) |
| *H01L 23/66* | (2006.01) |
| *H05K 1/03* | (2006.01) |
| *H05K 1/11* | (2006.01) |
| *H05K 1/16* | (2006.01) |
| *H05K 1/18* | (2006.01) |
| *H05K 3/00* | (2006.01) |
| *H05K 3/12* | (2006.01) |
| *H05K 3/20* | (2006.01) |
| *H05K 3/22* | (2006.01) |
| *H05K 3/40* | (2006.01) |
| *H05K 3/42* | (2006.01) |
| *H05K 3/46* | (2006.01) |
| *H01L 23/31* | (2006.01) |
| *H01L 23/498* | (2006.01) |

(52) U.S. Cl.
CPC ......... *H05K 1/0215* (2013.01); *H05K 1/0218* (2013.01); *H05K 1/0298* (2013.01); *H05K 1/0306* (2013.01); *H05K 1/115* (2013.01); *H05K 1/181* (2013.01); *H05K 3/005* (2013.01); *H05K 3/1241* (2013.01); *H05K 3/22* (2013.01); *H05K 3/403* (2013.01); *H05K 3/429* (2013.01); *H05K 3/4644* (2013.01); *H01L 23/15* (2013.01); *H01L 23/3121* (2013.01); *H01L 23/49822* (2013.01); *H01L 24/13* (2013.01); *H01L 24/16* (2013.01); *H01L 24/32* (2013.01); *H01L 24/48* (2013.01); *H01L 24/73* (2013.01); *H01L 24/92* (2013.01); *H01L 2224/131* (2013.01); *H01L 2224/16225* (2013.01); *H01L 2224/16227* (2013.01); *H01L 2224/32225* (2013.01); *H01L 2224/48091* (2013.01); *H01L 2224/48227* (2013.01); *H01L 2224/73204* (2013.01); *H01L 2224/92125* (2013.01); *H01L 2924/00014* (2013.01); *H01L 2924/15313* (2013.01); *H01L 2924/181* (2013.01); *H01L 2924/19105* (2013.01); *H05K 3/0052* (2013.01); *H05K 3/4629* (2013.01); *H05K 2201/0715* (2013.01); *H05K 2201/0919* (2013.01); *H05K 2201/09563* (2013.01); *H05K 2201/10098* (2013.01); *H05K 2201/10674* (2013.01)

(58) Field of Classification Search
CPC ........ H05K 1/0306; H05K 1/16; H05K 1/115; H05K 1/181; H05K 1/185; H05K 1/186; H05K 3/005; H05K 3/0052; H05K 3/20; H05K 3/22205; H05K 3/403; H05K 3/429; H05K 3/1241; H05K 3/3442; H05K 2201/0919; H05K 2201/09563; H05K 2201/10098; H05K 2201/10674; H05K 1/02; H05K 3/107; H05K 3/184; H01L 21/561; H01L 21/565; H01L 21/568; H01L 21/6835; H01L 23/15; H01L 23/29; H01L 23/50; H01L 23/60; H01L 23/66; H01L 23/552; H01L 23/3121; H01L 23/49575; H01L 23/49822; H01L 23/49811; H01L 23/49805; H01L 23/49838; H01L 24/13; H01L 24/14; H01L 24/16; H01L 24/17; H01L 24/19; H01L 24/32; H01L 24/48; H01L 24/73; H01L 24/92; H01L 24/96; H01L 24/97; H01L 2224/48; H01L 2224/97; H01L 2224/131; H01L 2224/227; H01L 2224/16225; H01L 2224/16227; H01L 2224/32225; H01L 2224/48901; H01L 2224/73204; H01L 23/295; H01L 23/564; H01L 23/565; H01L 23/3128

USPC ........ 361/783, 760, 818; 257/508, 660, 662, 257/664, 659, 688, 690, 98, 698, 738; 438/121; 174/250, 255

See application file for complete search history.

(56) References Cited

U.S. PATENT DOCUMENTS

| | | | | |
|---|---|---|---|---|
| 5,276,963 | A * | 1/1994 | Flanders | H05K 3/403 174/262 |
| 7,164,572 | B1 * | 1/2007 | Burdon | A61N 1/3754 361/321.2 |
| 7,656,677 | B2 * | 2/2010 | Ogawa | H01L 23/5383 174/260 |
| 7,696,442 | B2 * | 4/2010 | Muramatsu | H01L 21/4857 174/260 |
| 7,808,799 | B2 * | 10/2010 | Kawabe | H05K 1/185 361/728 |
| 8,212,340 | B2 * | 7/2012 | Liao | H01L 23/552 257/E23.114 |
| 8,350,367 | B2 * | 1/2013 | Chiu | H01L 23/552 257/659 |
| 8,525,337 | B2 * | 9/2013 | Pendse | H01L 24/27 257/737 |
| 8,786,060 | B2 * | 7/2014 | Yen | H01L 23/5225 438/63 |
| 2005/0067676 | A1 * | 3/2005 | Mahadevan | H01L 23/3107 257/659 |
| 2005/0186768 | A1 * | 8/2005 | Sugaya | H05K 3/20 438/597 |
| 2006/0012966 | A1 * | 1/2006 | Chakravorty | H01L 23/642 257/E23.079 |
| 2006/0266547 | A1 * | 11/2006 | Koga | H05K 1/0218 257/E23.125 |
| 2007/0076392 | A1 * | 4/2007 | Urashima | H01L 24/81 257/E23.07 |
| 2007/0117338 | A1 * | 5/2007 | Yamamoto | H05K 1/186 257/E23.079 |
| 2007/0152147 | A1 * | 7/2007 | Webster | H01L 31/0203 250/239 |
| 2008/0111233 | A1 * | 5/2008 | Pendse | H01L 24/13 257/E23.101 |
| 2009/0075428 | A1 * | 3/2009 | Tang | H01L 21/561 438/114 |
| 2010/0207259 | A1 * | 8/2010 | Liao | H01L 21/6835 257/E23.114 |
| 2010/0301475 | A1 * | 12/2010 | Hsu | H01L 24/17 257/738 |
| 2012/0119346 | A1 * | 5/2012 | Im | H01L 21/563 257/E23.18 |
| 2014/0183671 | A1 * | 7/2014 | Kuratani | B81B 7/0064 257/416 |
| 2015/0035127 | A1 * | 2/2015 | Yang | H01L 23/552 257/659 |
| 2015/0126134 | A1 * | 5/2015 | Lobianco | H01L 23/49827 361/783 |

(56) References Cited

U.S. PATENT DOCUMENTS

FOREIGN PATENT DOCUMENTS

| CN | 1870857 | 11/2006 |
| CN | 103400825 | 11/2013 |
| JP | H 10-223994 | 8/1998 |

* cited by examiner

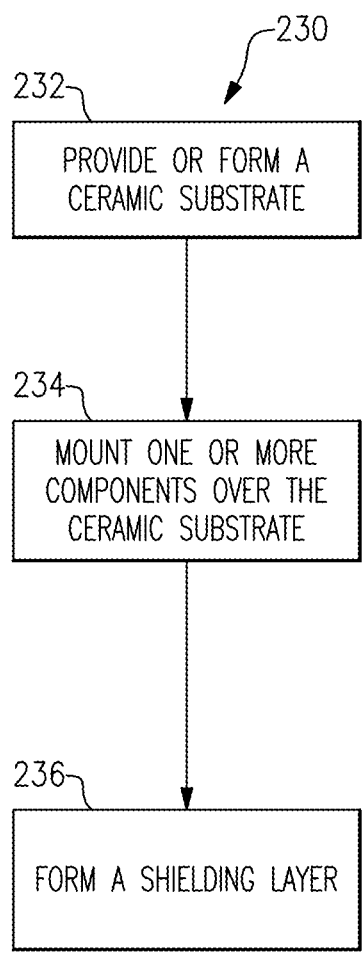
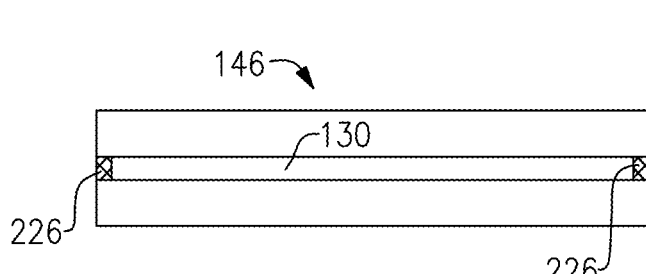
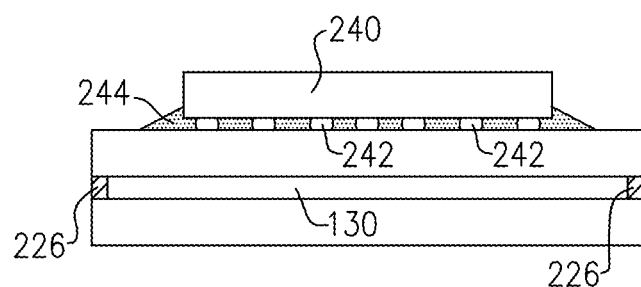
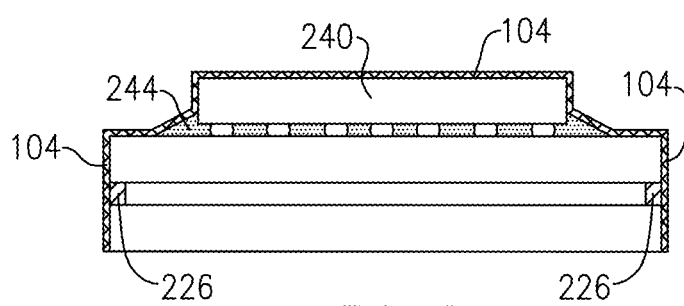
FIG. 17  FIG. 18

DEVICES AND METHODS RELATED TO METALLIZATION OF CERAMIC SUBSTRATES FOR SHIELDING APPLICATIONS

CROSS-REFERENCE TO RELATED APPLICATION(S)

This application is a continuation of U.S. patent application Ser. No. 16/940,075, filed Jul. 27, 2020, entitled "METHODS RELATED TO METALLIZATION OF CERAMIC SUBSTRATES FOR SHIELDING APPLICATIONS," which is a division of U.S. patent application Ser. No. 14/839,975, filed Aug. 29, 2015, entitled "DEVICES AND METHODS RELATED TO METALLIZATION OF CERAMIC SUBSTRATES FOR SHIELDING APPLICATIONS," now U.S. Pat. No. 10,729,001, issued Jul. 28, 2020, which claims priority to U.S. Provisional Patent Application No. 62/044,301, filed Aug. 31, 2014, entitled "DEVICES AND METHODS RELATED TO METALLIZATION OF CERAMIC SUBSTRATES FOR SHIELDING APPLICATIONS." The contents of each of the above-referenced application(s) are hereby expressly incorporated by reference herein in their entireties for all purposes.

BACKGROUND

Field

The present disclosure relates to metallization of ceramic substrates for shielding applications.

Description of Related Art

In radio-frequency (RF) applications, RF circuits and related devices can be implemented in a packaged module. Such a packaged module may include a ceramic substrate.

SUMMARY

In some implementations, the present disclosure relates to a ceramic assembly comprising a plurality of layers, the assembly including a boundary between a first region and a second region, the assembly further including a selected layer having a plurality of conductive features along the boundary, each conductive feature extending into the first region and the second region such that when the first region and the second region are separated to form their respective side walls, each side wall includes exposed portions of the conductive features capable of forming electrical connection with a conductive shielding layer.

In some embodiments, the assembly further includes a ground plane electrically connected to the plurality of conductive features.

In some embodiments, the ceramic assembly is in an unfired state to facilitate the separation of the first region and the second region.

In some embodiments, the conductive features include a plurality of rectangular conductive vias formed on or through the selected layer, such that the boundary extends generally through a middle portion of each rectangular conductive via.

In some embodiments, the conductive features include a plurality of shaped conductive vias formed on or through the selected layer, each shaped conductive via having a shape at or near the boundary that increases the likelihood of the separation occurring along the boundary.

In some embodiments, each conductive feature includes two circular shaped vias implemented along the boundary such that one circular shaped via is in the first region and the other circular shaped via is in the second region.

In some embodiments, the two circular shaped vias are in contact with each other.

In some implementations, the present disclosure relates to a method for fabricating a ceramic device. The method includes forming a plurality of conductive features on or through a selected layer along a boundary between a first region and a second region, each conductive feature extending into the first region and the second region. The method also includes forming an assembly that includes the selected layer and one or more other layers. The method further includes separating the first region and the second region along the boundary such that each of the first region and the second region forms a side wall, the side wall including exposed portions of the conductive features, the exposed portions capable of forming electrical connection with a conductive shielding layer.

In some embodiments, the ceramic device is an unfired device.

In some embodiments, the forming of the conductive features includes printing of a metal layer.

In some embodiments, the forming of the conductive features includes forming a plurality of conductive vias In some embodiments, the forming of the conductive vias includes punching a plurality of vias and filling of the punched vias with conductive material.

In some embodiments, the conductive material includes silver.

In some embodiments, the separating of the first region and the second region includes a cutting step.

In some embodiments, the cutting step includes a blade cutting step or a laser cutting step.

In some embodiments, the separating of the first region and the second region includes a dicing step.

In some embodiments, the separating of the first region and the second region includes a snapping step.

In some implementations, the present disclosure relates to a ceramic packaging substrate comprising a co-fired ceramic assembly of a plurality of layers, the assembly including a side wall resulting from separation of the assembly from another assembly, the side wall including a selected layer having a plurality of conductive features, each conductive feature including an exposed portion on the side wall, the exposed portion capable of forming electrical connection with a conductive shielding layer.

In some implementations, the present disclosure relates to a method for fabricating a ceramic packaging substrate. The method includes forming an assembly that includes a plurality of layers, the assembly further including a boundary between a first region and a second region, the assembly further including a selected layer having a plurality of conductive features along the boundary, each conductive feature extending into the first region and the second region. The method also includes separating the first region and the second region to yield their respective side walls, each side wall including exposed portions of the conductive features. The method further includes firing either or both of the separated first and second regions, such that the exposed portion of each of the conductive features on each side wall is capable of forming electrical connection with a conductive shielding layer.

In some implementations, the present disclosure relates to a packaged electronic device. The packaged electronic device includes a ceramic substrate configured to receive one or more components, the ceramic substrate including an assembly of a plurality of layers, the assembly including a side wall resulting from separation of the assembly from another assembly, the side wall including a selected layer having a plurality of conductive features, each conductive feature including an exposed portion on the side wall, each of the conductive features in electrical contact with a ground plane within the ceramic substrate. The packaged electronic device also includes a die having an integrated circuit, the die mounted on a surface of the ceramic substrate. The packaged electronic device further includes a conformal conductive layer sufficiently covering an upper surface over the die and the side wall, such that the conformal conductive layer is electrically connected with the ground plane through the exposed portions of the conductive features on the side wall to provide shielding functionality for the packaged electronic device.

In some embodiments, the die is a flip-chip device, such that the conformal conductive layer substantially covers the upper surface of the mounted die.

In some embodiments, the packaged electronic device further includes an overmold structure implemented over the ceramic substrate, the overmold structure including an upper surface such that the conformal conductive layer substantially covers the upper surface of the overmold structure.

In some implementations, the present disclosure relates to a method for fabricating a packaged electronic device. The method includes providing or forming a ceramic substrate configured to receive one or more components, the ceramic substrate including an assembly of a plurality of layers, the assembly including a side wall resulting from separation of the assembly from another assembly, the side wall including a selected layer having a plurality of conductive features, each conductive feature including an exposed portion on the side wall, each of the conductive features in electrical contact with a ground plane within the ceramic substrate. The method also includes mounting a die on a surface of the ceramic substrate, the die including an integrated circuit. The method further includes forming a conformal conductive layer to sufficiently cover an upper surface over the die and the side wall, such that the conformal conductive layer is electrically connected with the ground plane through the exposed portions of the conductive features on the side wall to provide shielding functionality for the packaged electronic device.

BRIEF DESCRIPTION OF THE DRAWINGS

FIG. 17 shows a process that can be implemented to form a shielded module having one or more features as described herein.

FIG. 18 shows examples of various stages associated with the process of FIG. 17.

DETAILED DESCRIPTION OF SOME EMBODIMENTS

The headings provided herein, if any, are for convenience only and do not necessarily affect the scope or meaning of the claimed invention.

Figure 1:
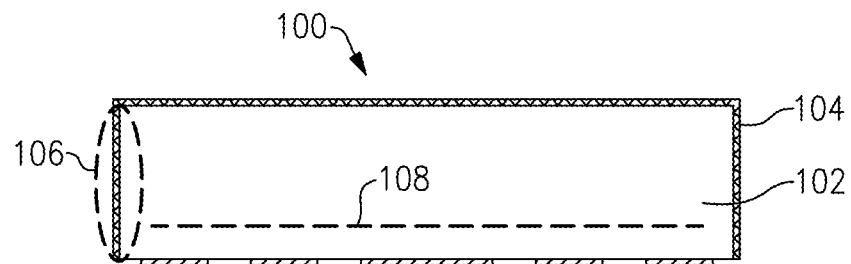
FIG. 1 shows an example of a radio-frequency (RF) module 100 having a bottom side configured to be mounted on a circuit board such as a phone board.

Disclosed are devices and methods related to metallization of ceramic substrates for shielding applications. FIG. 1 shows an example of a radio-frequency (RF) module 100 having a bottom side configured to be mounted on a circuit board such as a phone board. Such a bottom side can include a plurality of contact pads formed on a lower surface of a ceramic substrate generally indicated as 102. In FIG. 1, the module 100 can further include one or more components implemented over the ceramic substrate 102.

The ceramic substrate 102 can include one or more ground planes 108, and such ground plane(s) can be electrically connected to conductive features implemented on side walls of the module 100. Such conductive features can facilitate electrical connection between the ground plane(s) and a conductive layer 104. In some embodiments, the conductive layer 104 can be configured to cover five of the six example sides of the module 100. For example, the upper surface and the four side walls can be covered by the conductive layer 104 so as to provide shielding functionality, along with the ground plane(s), for the one or more components of the module 100.

Described herein are various examples of side wall connection configurations that can be implemented to provide such shielding functionality. In FIG. 1, such a side wall connection configuration is generally indicated as 106. Various examples are described in the context of low-temperature co-fired ceramic (LTCC) technology; however, it will be understood that one or more features of the present disclosure can also be implemented in other types of ceramic substrate technologies, as well as in non-ceramic substrate technologies. In various examples disclosed herein, LTCC substrates are sometimes referred to as ceramic substrates.

In the example of FIG. 1, the RF module 100 is an individual module. As described herein, such a module can be one of a number of modules that can be fabricated together during at least a portion of the manufacturing process. Examples of such a manufacturing process are described herein in greater detail.

Figure 2A:
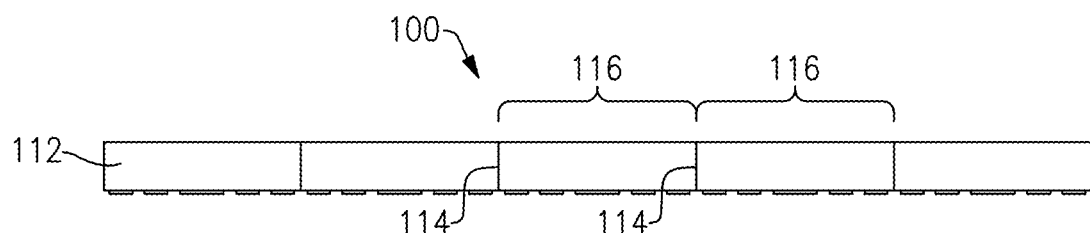
FIGS. 2A and 2B show side and plan views of a panel of an LTCC substrate having an array of individual units that are yet to be singulated.
Figure 2B:
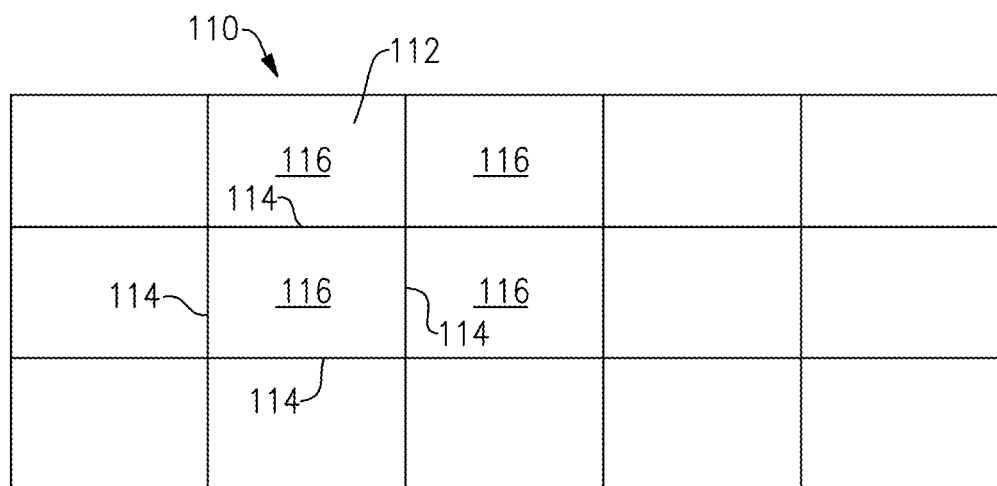

FIGS. 2A and 2B show side and plan views of a panel 110 of an LTCC substrate 112 having an array of individual units 116 that are yet to be singulated. Such singulation can be made along cut lines 114 utilizing techniques such as cutting, snapping, dicing, or some combination thereof. As described herein, the LTCC panel 110 can be configured to facilitate the side wall connection configuration 106 of FIG. 1 once the individual units 116 are separated from each other.

Figure 3:
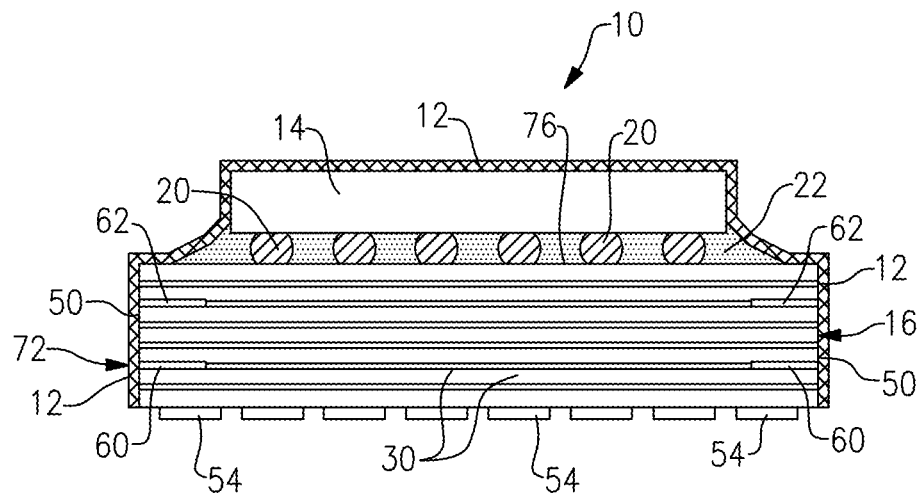
FIG. 3 shows an example of an RF module that includes a ceramic substrate such as an LTCC substrate.
Figure 4A:
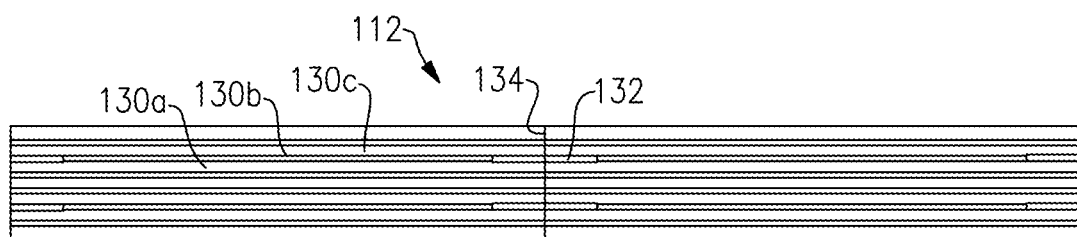
FIGS. 4A-4C show an example of how the ceramic substrate of FIG. 3 can be fabricated.
Figure 4B:
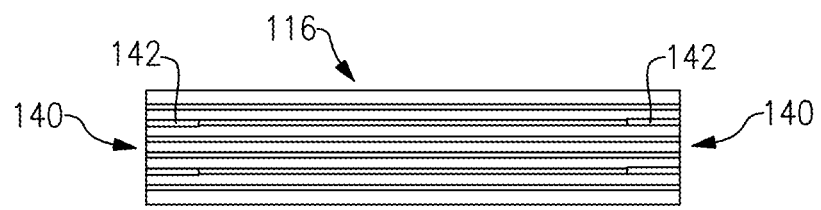
Figure 4C:
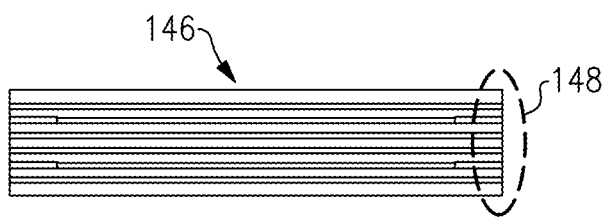

FIG. 3 shows an example of an RF module 10 that includes a ceramic substrate such as an LTCC substrate 16. Such a substrate can be obtained from an array as shown in FIGS. 4A-4C. In FIG. 4, the example module 10 can include a flip-chip 14 mounted on the ceramic substrate 16. Such a mounting of the flip-chip 14 on the ceramic substrate 16 can be facilitated by an array of solder balls 20. Such solder balls 20 can provide mechanical mounting functionality, as well as electrical connections between the flip-chip 14 and contact pads formed on a mounting surface 76 of the ceramic substrate 16.

As shown in FIG. 3, an underfill 22 can be formed between the flip-chip 14 and the ceramic substrate 16. Such an underfill can be configured near the edges of the flip-chip 14 so as to facilitate easier formation of a conformal coating 12 of conductive material. For example, the peripheral portion of the underfill 22 is shown to provide an angled transition between the vertical edges of the flip-chip 14 and the horizontal surface 76 of the ceramic substrate 16.

In some embodiments, the conformal coating 12 can be formed by application of conductive material by, for example, spraying or various deposition methods. Such a coating of conductive material can provide shielding functionality of portions it covers. The overall shielding performance for the packaged device 10 can be greatly enhanced by also providing lateral shielding at the edges of the ceramic substrate 16, as well as a ground plane underneath the flip-chip 14 (e.g., within the ceramic substrate 16).

In the example shown in FIG. 3, an electrical connection configuration 72 can include the conformal conductive coating 12 extending from the upper surface 76 of the ceramic substrate 16 to generally cover the side edges of the ceramic substrate 16. Such conformal conductive coating 12 covering the side edges of the ceramic substrate 16 are shown to be in electrical contact with one or more conductive layers within the ceramic substrate 16 and extending to their respective edges of the ceramic substrate 16. For example, conductive layers 60, 62 are shown to be implemented so that their edges generally align with respective edges (50) of the ceramic substrate 16. Accordingly, the conductive layers 60, 62 are shown to be in electrical contact with the conformal conductive coating 12. Thus, combined with the ground plane (not shown, but in electrical contact with the conductive layers 60, 62), the conformal conductive coating 12 provides shielding functionality for the packaged device 10.

As shown in FIG. 3, the ceramic substrate 16 can include a plurality of layers and features 30. Such layers and features can include, for example, dielectric layers, passive components (such as resistors, capacitors and inductors), conductor features (such as vias and traces), and a ground plane (not shown). In such a context, the example conductive layers 60, 62 can be formed at selected lateral locations and at their respective selected layers.

As also shown in FIG. 3, the packaged device 10 can include contact pads 54 that allow mounting of the packaged device 10 on a circuit board (e.g., a phone board) and electrical connections between the packaged device 10 and the circuit board.

FIGS. 4A-4C show an example of how the ceramic substrate 16 of FIG. 3 can be fabricated. As shown in FIG. 4A, a panel 112 can be fabricated so as to yield a plurality of layers 130. Such layers can include, for example, layers 130a, 130b and 130c. Among such example layers, the layer 130b is shown to include a conductive feature 132 implemented so as to straddle a cut line 134. Such a conductive feature 132 can be formed by, for example, patterned printing of conductive material such as silver. The conductive feature 132 can be electrically connected to respective ground planes (not shown). For example, the left side of the conductive feature 132 can be electrically connected to a ground plane associated with the unit left of the cut line 134. Similarly, the right side of the conductive feature 132 can be electrically connected to a ground plane associated with the unit right of the cut line 134.

FIG. 4B shows an individual unit 116 obtained by singulation of the panel 112 of FIG. 4A. Such a singulated individual unit 116 is shown to include edges 140 resulting from singulation along the cut lines 134. Such edges are shown to include conductive features 142 resulting from cutting of the conductive features 132 of FIG. 4A. The exposed ends of the conductive features 142 can form electrical contacts with a conformal shielding layer (e.g., 12 in FIG. 3) to thereby provide electrical connection between the conformal shielding layer and the ground plane(s) associated with the conductive features 142.

In some embodiments, the foregoing singulation of the panel 112 into individual units can be performed before the firing process. Once singulated, the individual units can be fired (also referred to herein as sintered) so as to yield fired individual units 146, one of which is shown in FIG. 4C. Such a fired unit can be utilized as a ceramic substrate for mounting of one or more components, such as in the example of FIG. 3. The fired unit 146 can include an edge configuration 148 that can facilitate the electrical connection between the conformal shielding layer (e.g., 12 in FIG. 3) and the ground plane(s). Examples associated with such an edge configuration are described herein in greater detail.

Figure 5A:
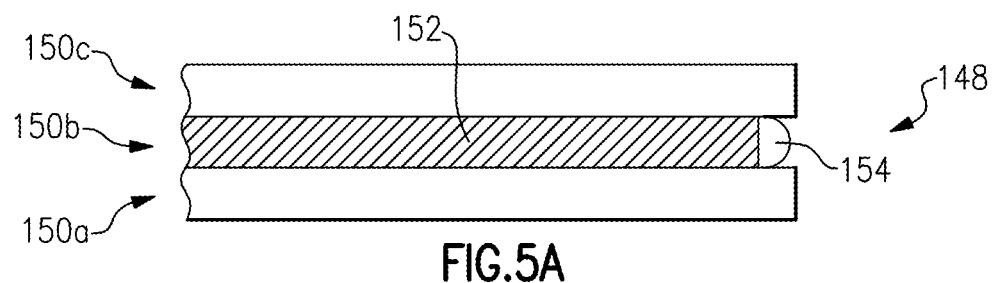
FIGS. 5A-5C show examples of such variations that can occur for a given cut edge configuration.
Figure 5B:
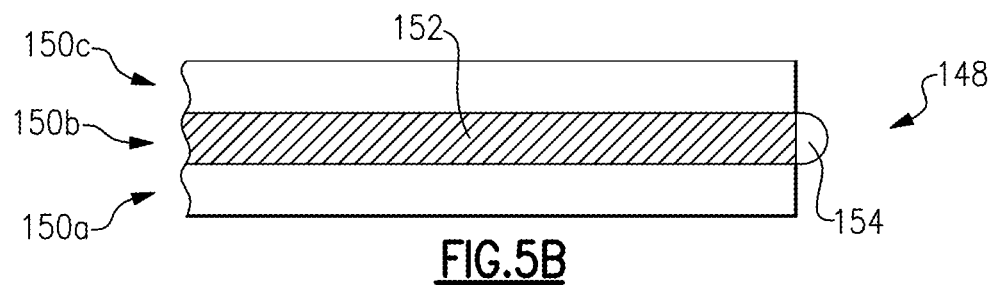
Figure 5C:
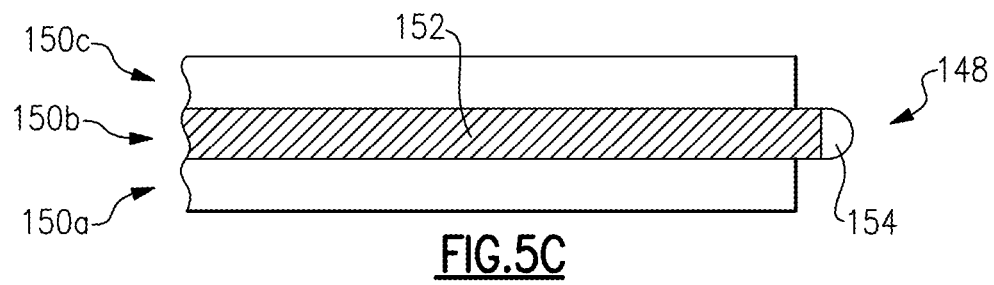

When a completed ceramic substrate having a plurality of layers is singulated and sintered, cut edges can have variations due to, for example, singulation tolerances, variations in thermal shrinkage among the layers, or some combination thereof. FIGS. 5A-5C show examples of such variations that can occur for a given cut edge configuration 148. In FIGS. 5A-5C, it is assumed that a conductive feature 152 is formed as part of a layer 150b which is between layers 150a and 150c. Further, plating (e.g., Pd, Cu, Ag, Au, Ni, or alloys that can include such metals) 154 is shown to be formed at the end of the conductive feature 152 so as to facilitate electrical connection with the conformal shielding layer (not shown). In some embodiments, such plating may or may not be present.

As shown in FIG. 5A, there can be a variation where the edge of the conductive feature 152 is recessed relative to the edges of the layers 150a and 150c. Such a recessed configuration can occur due to, for example, the layer 150b undergoing greater amount of shrinkage than the layers 150a, 150c. If such a recess is sufficiently deep, electrical connection between the conductive feature 152 and the conformal shielding layer (not shown) may be degraded.

As shown in FIG. 5B, there can be a variation where the edge of the conductive feature 152 is substantially flush relative to the edges of the layers 150a and 150c. Such a configuration can be a preferred configuration; however, it may or may not be a likely configuration.

As shown in FIG. 5C, there can be a variation where the edge of the conductive feature 152 protrudes beyond the edges of the layers 150a and 150c. Such a recessed configuration can occur due to, for example, the layer 150b undergoing lesser amount of shrinkage than the layers 150a, 150c. If such a protrusion is sufficiently large, contiguousness of the conformal shielding layer (not shown) may be degraded.

As shown in FIGS. 5A-5C, the position of the edge of the conductive feature 152 relative to the edges of other layers can vary. If a conductive feature 152 for a given edge of a ceramic substrate is generally a contiguous piece, the entire edge of that conductive feature can vary together with the edges of the other layers. Accordingly, integrity of electrical connection between the single-piece conductive feature and the conformal shielding layer can be good or bad together. If such a single-piece conductive feature is the only one for a given edge of a ceramic substrate unit, integrity of grounding connection for the conformal shielding layer can be determined by the single-piece conductive feature.

Figure 6A:
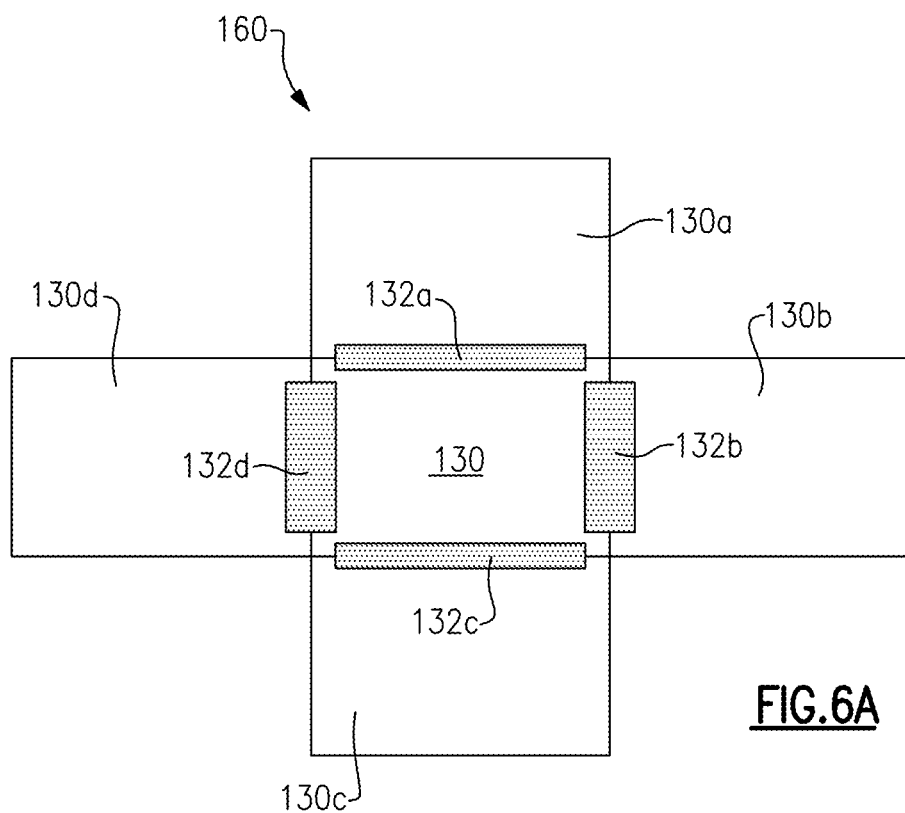
FIG. 6A shows an example configuration where a single contiguous conductive feature is implemented along each boundary of a unit region as a rectangular piece.

FIGS. 6 and 7 show examples of conductive features that can be implemented as single-piece features for their respective edges in ceramic substrate units. FIG. 6A shows an example configuration 160 where a single contiguous conductive feature (e.g., printed silver layer) 132 is implemented along each boundary of a unit region 130 as a rectangular piece. For example, a conductive feature 132a is shown to be formed along a boundary between the unit region 130 and a neighboring region 130a. Similarly, conductive features 132b, 132c, 132d are shown to be formed along boundaries between the unit region 130 and their respective neighboring regions 130b, 130c, 130d.

Figure 6B:
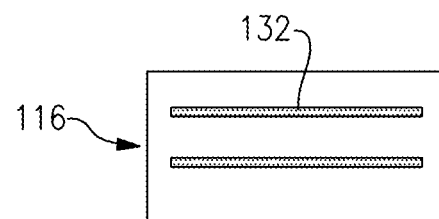
FIG. 6B shows a side edge of an individual unit that can result from the example configuration of FIG. 6A.

FIG. 6B shows a side edge of an individual unit 116 that can result from the example configuration of FIG. 6A. An exposed edge of the conductive feature 132 is shown to extend along a large portion of the lateral dimension of the side edge. In some embodiments, and as shown in FIG. 6B, each edge of the individual unit 116 can include one or more of such conductive features. In embodiments where more than one of such conductive features are provided for a given edge, overall electrical connection between the conformal shielding layer and ground plane(s) can be improved.

Figure 7A:
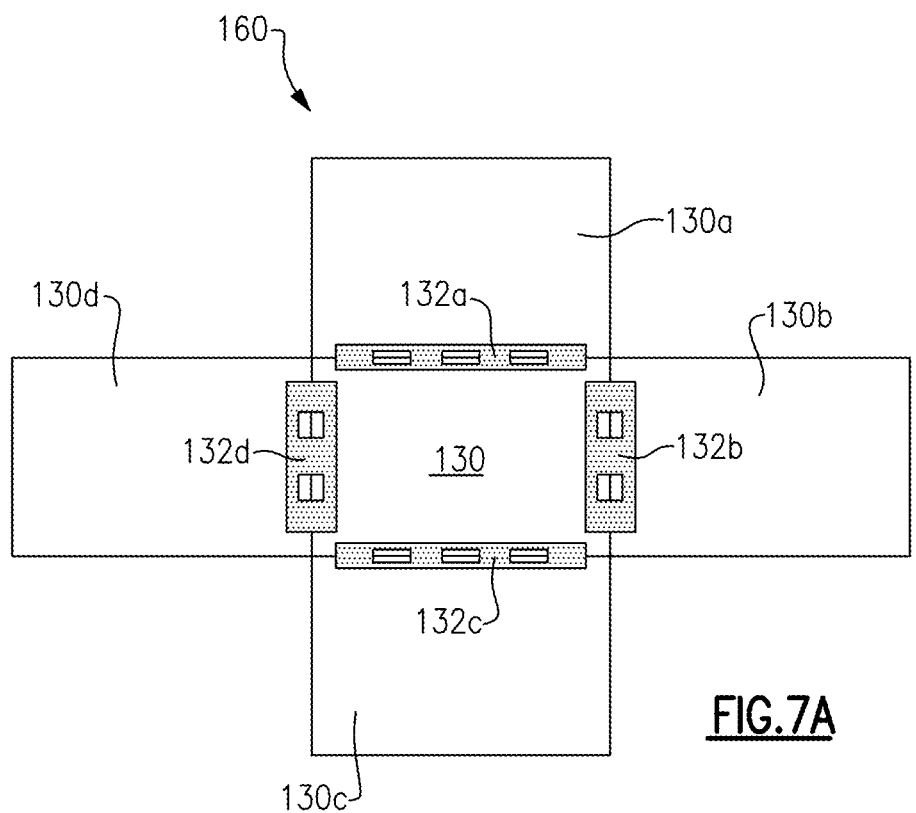
FIG. 7A shows another example configuration where a single contiguous conductive feature is implemented along each boundary of a unit region as a rectangular piece with one or more openings.

FIG. 7A shows another example configuration 160 where a single contiguous conductive feature (e.g., printed silver layer) 132 is implemented along each boundary of a unit region 130 as a rectangular piece with one or more openings. For example, a conductive feature 132a is shown to be formed along a boundary between the unit region 130 and a neighboring region 130a. Similarly, conductive features 132b, 132c, 132d are shown to be formed along boundaries between the unit region 130 and their respective neighboring regions 130b, 130c, 130d. When such conductive features are processed and cut, each edge of a given individual unit can include a continuous spine that is buried, and a plurality of extensions from the spine to exposed ends at the edge of the individual unit.

Figure 7B:
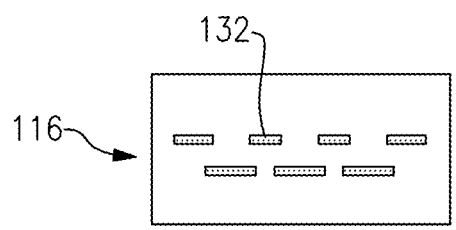
FIG. 7B shows a side edge of an individual unit 116 that can result from the example configuration of FIG. 7A.

FIG. 7B shows a side edge of an individual unit 116 that can result from the example configuration of FIG. 7A. Exposed portions of the conductive feature 132 are shown to be aligned along a layer of the side edge. In some embodiments, and as shown in FIG. 7B, each edge of the individual unit 116 can include one or more of such conductive features. In embodiments where more than one of such conductive features are provided for a given edge, overall electrical connection between the conformal shielding layer and ground plane(s) can be improved.

FIGS. 8 and 9 show examples of conductive features that can be implemented as two or more features for their respective edges in ceramic substrate units. Such plurality of conductive features along a given edge can reduce the sensitivity of shielding layer-to-ground electrical connection resulting from variations associated with single-piece conductive feature(s) due to mechanical and/or thermal effects.

Figure 8A:
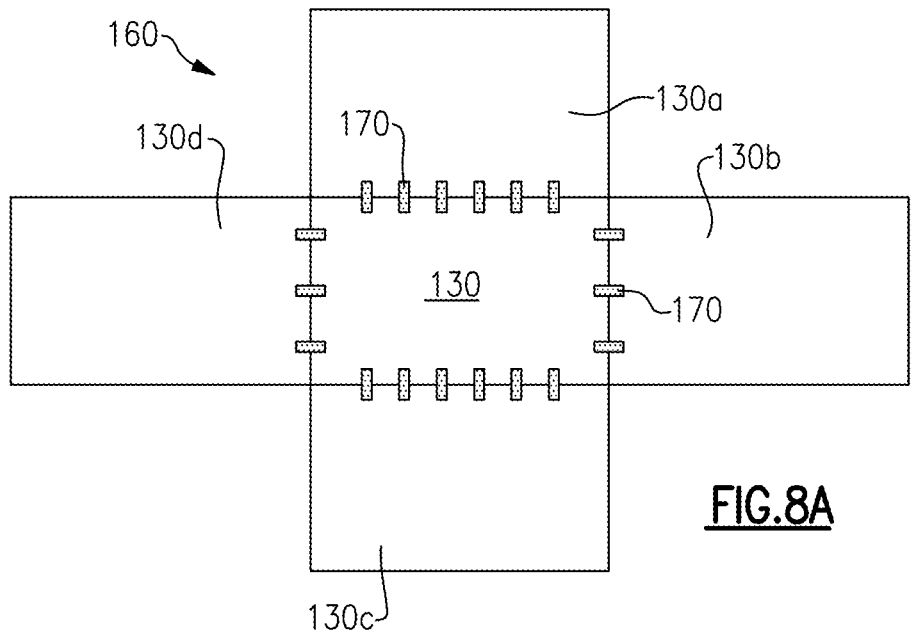
FIG. 8A shows an example configuration where a plurality of conductive features are implemented along each boundary of a unit region.

FIG. 8A shows an example configuration 160 where a plurality of conductive features (e.g., punched and filled vias in a layer) 170 are implemented along each boundary of a unit region 130. In the example of FIG. 8A, each conductive feature can be a via (e.g., punched and filled) having a rectangular shape that straddles the corresponding boundary. Such conductive features 170 are shown to be formed along a boundary between the unit region 130 and a neighboring region 130a. Similarly, conductive features 170 are shown to be formed along boundaries between the unit region 130 and their respective neighboring regions 130b, 130c, 130d.

Figure 8B:
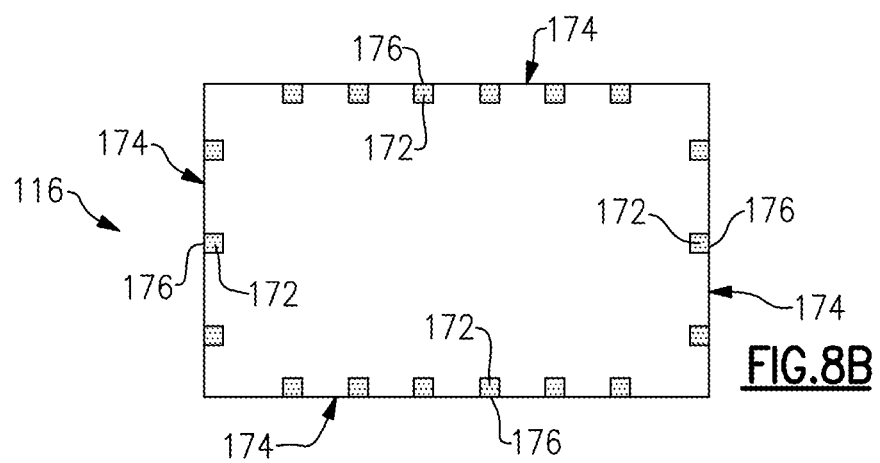
FIGS. 8B and 8C show plan and side views of an individual unit that can result from the example configuration of FIG. 8A.
Figure 8C:
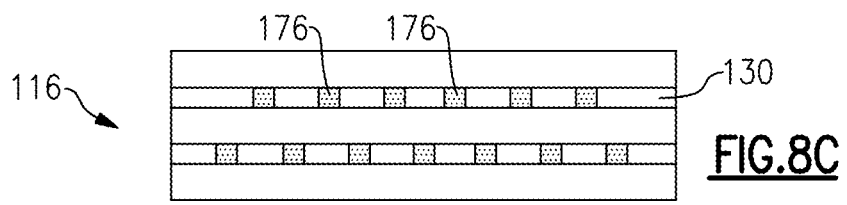

FIGS. 8B and 8C show plan and side views of an individual unit 116 that can result from the example configuration of FIG. 8A. Exposed portions 176 of the conductive features 172 (resulting from the conductive features 170 being cut) are shown to be aligned along a layer of each side edge 174. In some embodiments, and as shown in FIG. 8C, each edge of the individual unit 116 can include one or more sets of such conductive features. In embodiments where more than one of such sets of conductive features are provided for a given edge, overall electrical connection between the conformal shielding layer and ground plane(s) can be improved.

Figure 9A:
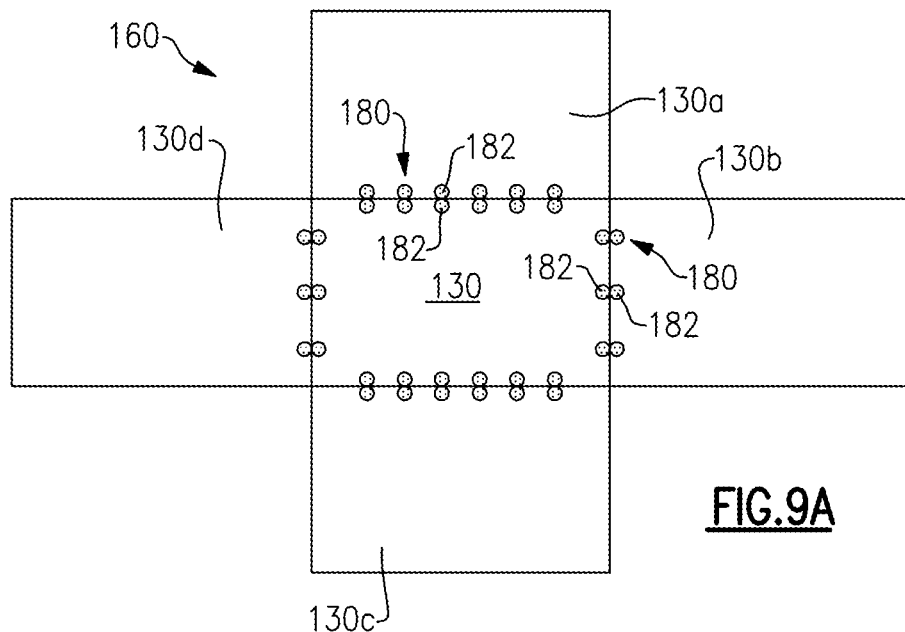
FIG. 9A shows another example configuration where a plurality of conductive features are implemented along each boundary of a unit region.

FIG. 9A shows another example configuration 160 where a plurality of conductive features (e.g., printed in silver and/or vias filled with conductive material) 180 are implemented along each boundary of a unit region 130. In the example of FIG. 9A, each conductive feature 180 is shown to include a pair of circular shaped vias 182, with one via on one region and the other via on the neighboring region. Such conductive features 180 are shown to be formed along a boundary between the unit region 130 and a neighboring region 130a. Similarly, conductive features 180 are shown to be formed along boundaries between the unit region 130 and their respective neighboring regions 130b, 130c, 130d.

Figure 9B:
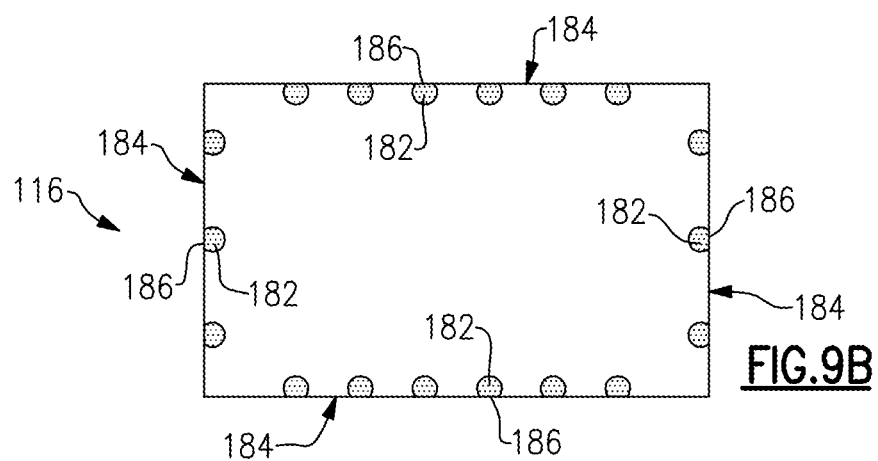
FIGS. 9B and 9C show plan and side views of an individual unit that can result from the example configuration of FIG. 9A.
Figure 9C:
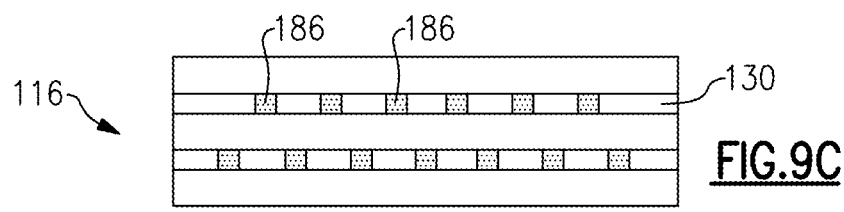

FIGS. 9B and 9C show plan and side views of an individual unit 116 that can result from the example configuration of FIG. 9A. Exposed portions 186 of the conductive features 182 (resulting from the conductive features 180 being cut) are shown to be aligned along a layer of each side edge 184. In some embodiments, and as shown in FIG. 9C, each edge of the individual unit 116 can include one or more sets of such conductive features. In embodiments where more than one of such sets of conductive features are provided for a given edge, overall electrical connection between the conformal shielding layer and ground plane(s) can be improved.

Figure 10A:
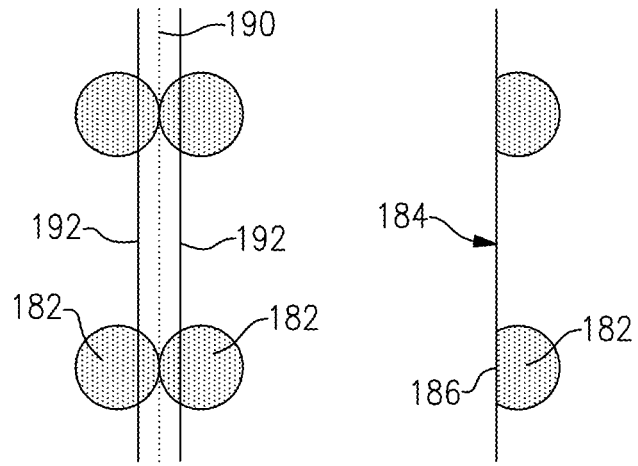
FIGS. 10A-10C show non-limiting examples of how the circular vias can be arranged for each conductive feature of FIG. 9A.
Figure 10B:
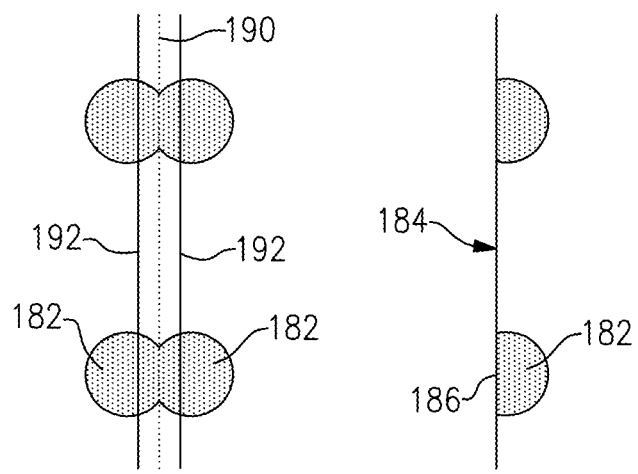
Figure 10C:
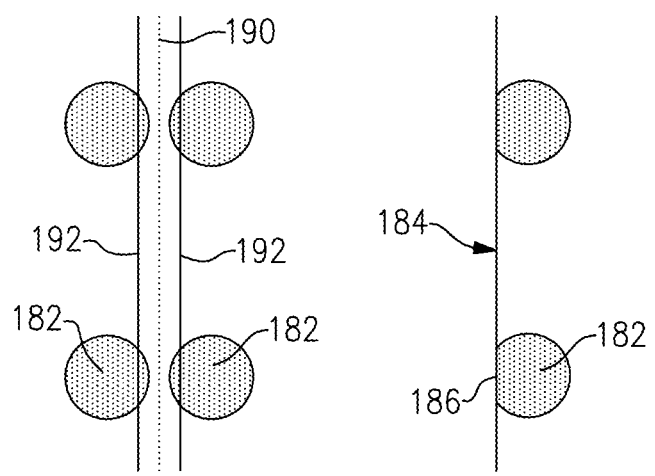

FIGS. 10A-10C show non-limiting examples of how the circular vias 182 can be arranged for each conductive feature 180 of FIG. 9A. In the example of FIG. 10A, the two circular vias 182 are shown to touch generally along a boundary 190, but not overlap. Such a configuration can allow certain types of singulation (e.g., snapping) to occur more likely along the boundary. Also shown in FIG. 10A are lines 192 on both sides of the boundary line 190 representative of space needed to separate (e.g., by cutting) the two neighboring units. With such a space taken into account, the right side of FIG. 10A shows a separated unit having its side edge 184. Along such a side edge are a plurality of exposed portions 186 of the circular vias 182.

In the example of FIG. 10B, the two circular vias 182 are shown to partially overlap. Such a configuration can also allow certain types of singulation (e.g., snapping) to occur more likely along the boundary 190. Also shown in FIG. 10B are lines 192 on both sides of the boundary line 190 representative of space needed to separate (e.g., by cutting) the two neighboring units. With such a space taken into account, the right side of FIG. 10B shows a separated unit having its side edge 184. Along such a side edge are a plurality of exposed portions 186 of the circular vias 182. In the example of FIG. 10B, the exposed portions 186 are larger than those of the example of FIG. 10A (assuming that the circular vias 182 have the same diameter in FIGS. 10A and 10B).

FIG. 10C shows that in some embodiments, the two vias 182 of a given conductive feature 180 do not necessarily need to touch. If positioned sufficiently close to each other, the separation area (e.g., by cutting, double cutting, or dicing) defined by the lines 192 can yield exposed portions 186 of the vias 182 along the edge 184. Assuming the same cutting area and same via size, the example arrangement of vias in FIG. 10C results in the exposed portions 186 being smaller than the examples of FIGS. 10A and 10B.

In the examples of FIGS. 10A-10C, the conductive features are depicted as being a plurality of pairs of shaped conductors (e.g., pairs of circular shaped conductors). It will be understood that in some embodiments, more or less numbers of shaped conductors can be implemented instead of such pairs. For example, a single shaped conductor (e.g., a circular shaped conductor) dimensioned appropriately can replace a pair of conductors, and such a single shaped conductor can be, for example, cut along its middle portion.

Figure 11A:
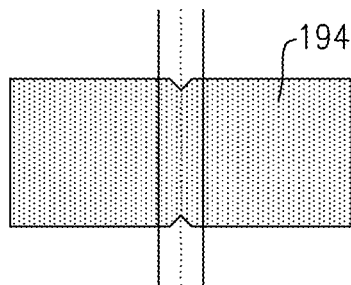
FIGS. 11A-11C show that other shapes of conductive features can also be implemented instead of circular or rectangular shaped vias.
Figure 11A:
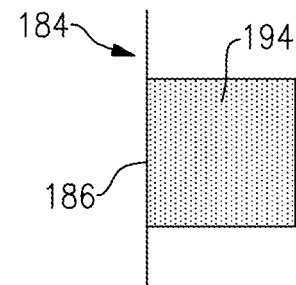
Figure 11B:
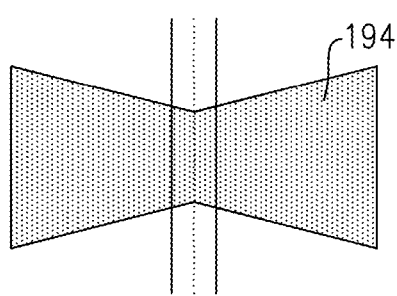
Figure 11B:
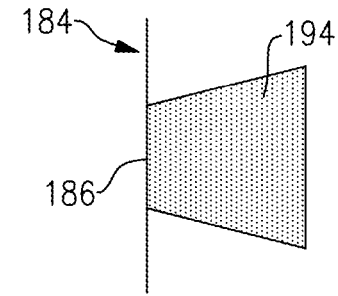
Figure 11C:
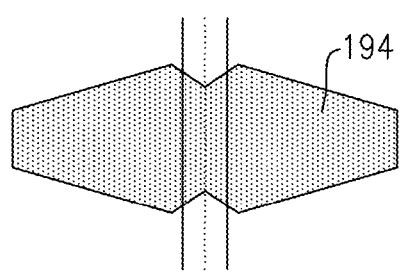
Figure 11C:
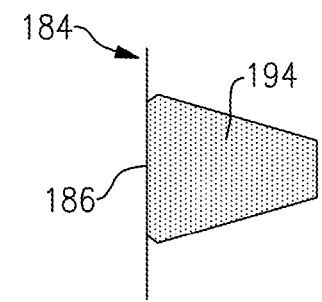

FIGS. 10A-10C show examples how various design parameters for conductive features 180 can be adjusted to yield different edge configurations. FIGS. 11A-11C show that other shapes of conductive features can also be implemented instead of circular or rectangular shaped vias. In FIG. 11A, a conductive feature 194 is shown to be similar to the rectangular shaped example of FIGS. 8A-8C, but with notches along the boundary. In some embodiments, such notches can promote separation along the boundary. When the two neighboring units are separated, such a conductive feature is shown to yield an exposed portion 186 on an edge 184.

In FIG. 11B, a conductive feature 194 is shown to have a smaller waist dimension at the boundary than at the ends to define, for example, a bow-tie shape. Such a waist configuration at the boundary can promote separation along the boundary. When the two neighboring units are separated, such a conductive feature is shown to yield an exposed portion 186 on an edge 184.

In FIG. 11C, a conductive feature 194 is shown to have a larger waist dimension at the boundary than at the ends. Such an example waist is shown to include notches along the boundary; and such notches can promote separation along the boundary. When the two neighboring units are separated, such a conductive feature is shown to yield an exposed portion 186 on an edge 184.

Figure 12:
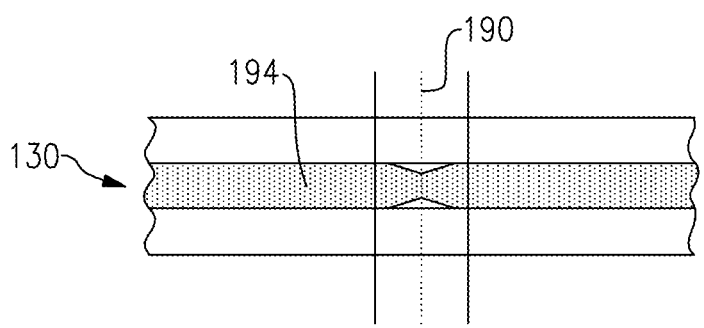
FIG. 12 shows that in some embodiments, vertical profiles can also be configured to provide desirable functionalities.

In the examples of FIGS. 10 and 11, various shapes are described in the context of lateral shapes. FIG. 12 shows that in some embodiments, vertical profiles can also be configured to provide desirable functionalities. For example, a layer 130 is shown to include a conductive feature 194 that straddles a boundary 190 between two neighboring units. Such a conductive feature can include notch feature(s) at either or both sides of the layer 130 so as to promote separation along the boundary 190.

One can see from the various examples that conductive features implemented as described herein can provide advantageous functionalities in providing reliable electrical connection with a conformal shielding layer. It will be understood that such conductive features can be electrically connected to one or more ground planes within a ceramic substrate such that the conformal shielding layer in combination with the ground plane(s) provide RF shielding for the corresponding module.

Figure 13:
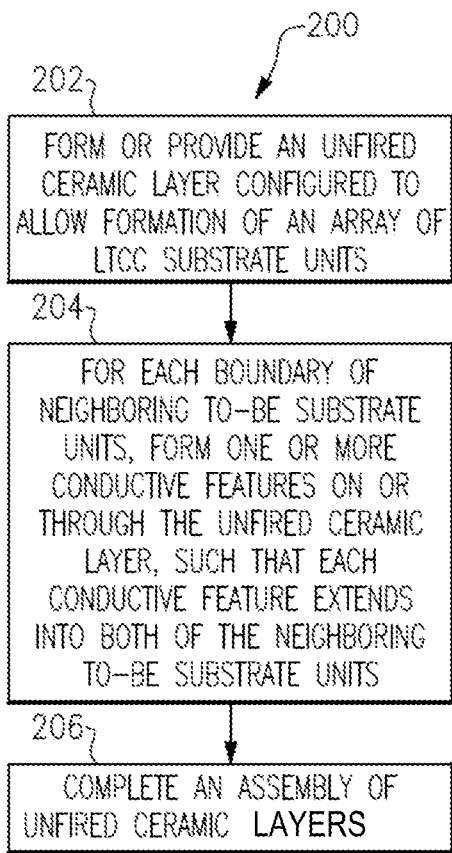
FIG. 13 shows a process that can be implemented to fabricate an assembly of ceramic layers having one or more features as described herein.
Figure 14:
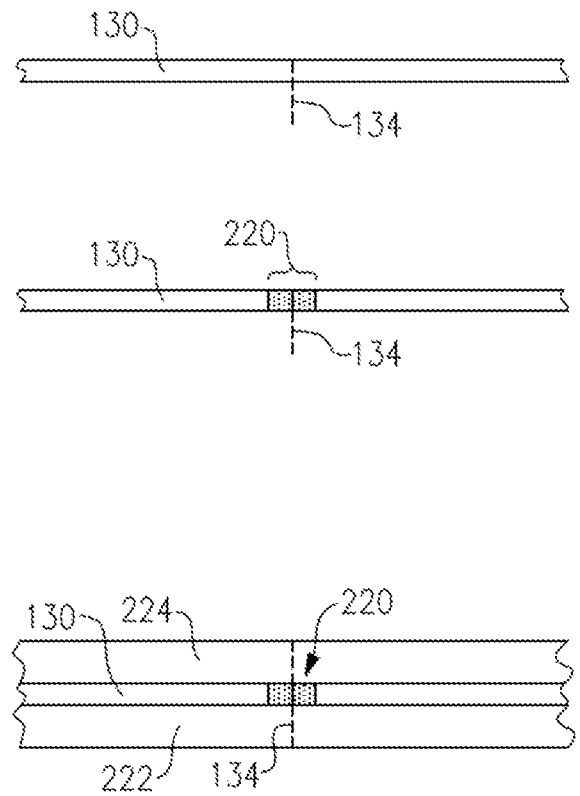
FIG. 14 shows examples of various stages associated with the process of FIG. 13.

FIG. 13 shows a process 200 that can be implemented to fabricate an assembly of ceramic layers having one or more features as described herein. FIG. 14 shows examples of various stages associated with the process 200 of FIG. 13.

In block 202, an unfired ceramic layer can be provided. Such a ceramic layer can be configured to allow formation of an array of LTCC substrate units. In FIG. 14, such a ceramic layer is depicted as 130, with a boundary 134 between two neighboring units. In block 204, one or more conductive features can be formed on or through the unfired ceramic layer for each boundary of neighboring units. Such conductive feature(s) can extend into both of the neighboring units. In FIG. 14, such a conductive feature (e.g., a conductive via) is depicted as 220; and such a conductive feature is shown straddle the boundary 134 and extend into both of the two neighboring units. In block 206, an assembly of unfired ceramic layers, including the foregoing ceramic layer with the conductive feature 220, can be assembled.

Figure 15:
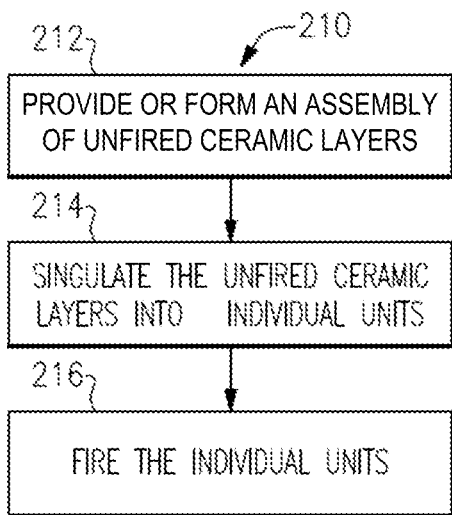
FIG. 15 shows a process that can be implemented to form a plurality of individual ceramic substrate units having one or more features as described herein.
Figure 16:
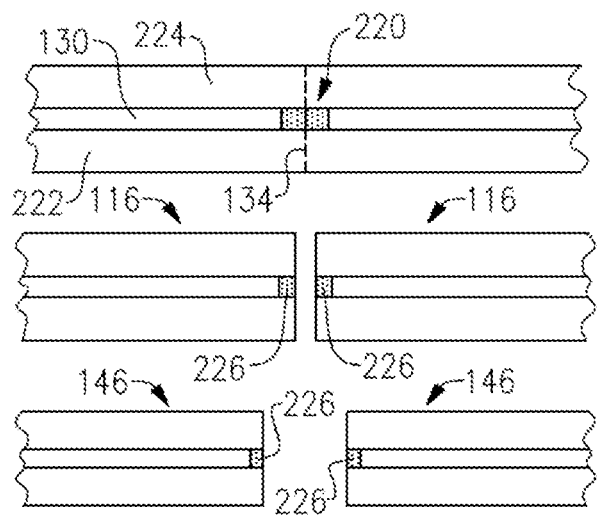
FIG. 16 shows examples of various stages associated with the process of FIG. 15.

FIG. 15 shows a process 210 that can be implemented to form a plurality of individual ceramic substrate units having one or more features as described herein. FIG. 16 shows examples of various stages associated with the process 210 of FIG. 15.

In block 212, an assembly of unfired ceramic layers can be provided or formed. Such an assembly can be the assembly resulting from the process 200 of FIG. 13. In FIG. 16, such an assembly is depicted as having a layer 130 with a conductive feature 220 implemented between two neighboring units so as to straddle a boundary 134. Additional layers 222, 224 are shown to be below and above the layer 130.

In block 214, the unfired ceramic layers can be singulated into a plurality of individual units. In FIG. 16, such singulated individual units are depicted as 116. Each of the two individual units 116 shown includes a side edge with an exposed portion of a conductive feature 226 resulting from the conductive feature 220 being split during the singulation process.

In block 216, the individual units can be fired so as to yield individual ceramic substrates ready to receive one or more components thereon. In FIG. 16, such fired ceramic substrate units are depicted as 146. Each of the two individual units 146 shown includes the side edge with the exposed portion of the conductive feature 226.

FIG. 17 shows a process 230 that can be implemented to form a shielded module having one or more features as described herein. FIG. 18 shows examples of various stages associated with the process 230 of FIG. 17.

In block 232, ceramic substrate can be provided or formed. Such a ceramic substrate can be the fired ceramic substrate resulting from the process 210 of FIG. 15. In FIG. 18, such a ceramic substrate 146 is depicted as having a layer 130 with a conductive feature 226 implemented at each of the two opposing edges. Although not shown in FIG. 18, each of the other two edges of the ceramic substrate can also include such conductive feature(s).

In block 234, one or more components can be mounted over the ceramic substrate. In FIG. 18, a flip-chip device 240 is shown to be mounted on the ceramic substrate through solder balls 242. An underfill 244 is shown to be provided between the flip-chip device 240 and the ceramic substrate. It will be understood that other types of devices can also be mounted on the ceramic substrate, with or without the flip-chip device 240.

In block 236, a conformal shielding layer can be formed so as to substantially cover the upper portion of the ceramic substrate and component(s) mounted thereon, as well as some or all of the side walls of the ceramic substrate. Such a conformal shielding layer can be formed by, for example, sputtering, spray painting, etc. In FIG. 18, such a conformal shielding layer 104 is depicted as covering the flip-chip device 240, the exposed portion of the underfill 244, the exposed portion of the upper surface of the ceramic substrate, and the side walls of the ceramic substrate. The side wall portion of the conformal shielding layer 104 is shown to form an electrical connection with the conductive features 226, such that the conformal shielding layer 104 is electrically connected to one or more ground planes within the ceramic substrate.

Figure 19:
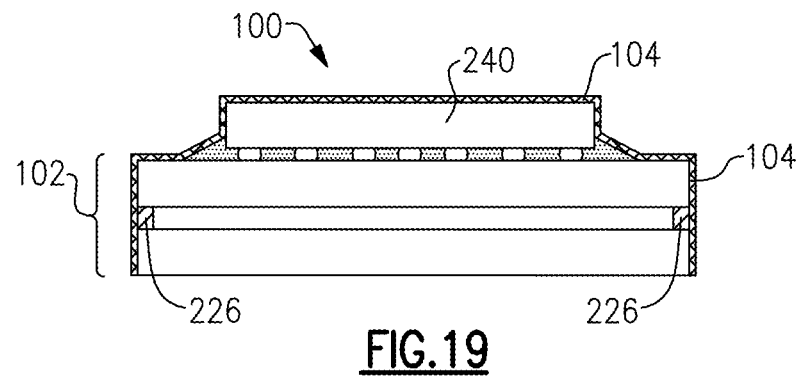
FIGS. 19 and 20 show that ceramic substrates having one or more features as described herein can be utilized as packaging substrates for flip-chip devices, as well as other mountable devices.
Figure 20:
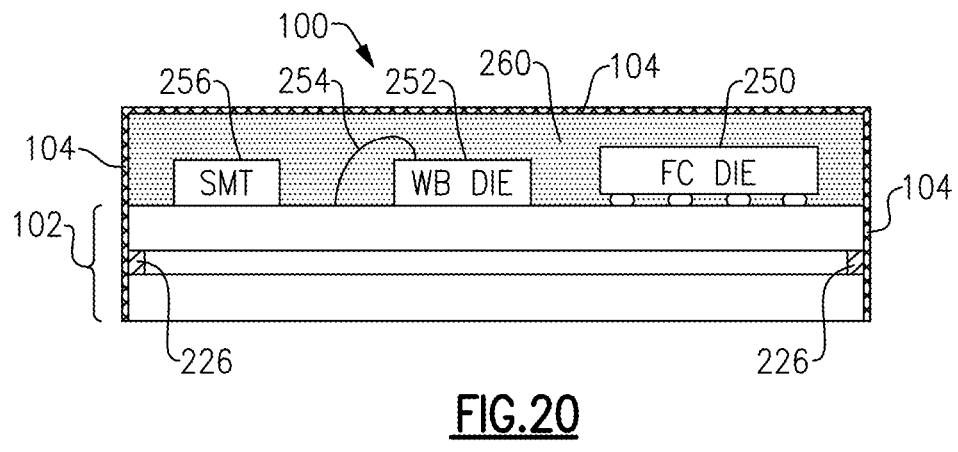

FIGS. 19 and 20 show that ceramic substrates having one or more features as described herein can be utilized as packaging substrates for flip-chip devices, as well as other mountable devices. In FIG. 19, an RF module 100 having a conformal shielding layer 104 can be similar to the example described in reference to FIGS. 17 and 18. More particularly, a flip-chip device 240 is shown to be mounted on a ceramic substrate 102 having one or more features as described herein. Such features can include conductive features 226 implemented on some or all of the side walls of the ceramic substrate 102 so as to facilitate electrical connection between the conformal shielding layer 104 and one or more ground planes within the ceramic substrate 102.

FIG. 20 shows that in some embodiments, a ceramic substrate having one or more features as described herein can be utilized as a packaging substrate for a plurality of components. Such components may or may not include a flip-chip device. In FIG. 20, an RF module 100 is shown to include a ceramic substrate 102 that includes one or more conductive features 226 along each wall. Examples of components that can be mounted on such a ceramic substrate include a flip-chip die 250, a wirebond die 252, and an SMT device 256. For the flip-chip die 250, electrical connections functionality can be provided by a plurality of solder balls. For the wirebond die 252, electrical connections can be provided through wirebonds 254, terminals (not shown) on the underside of the die 252, or some combination thereof. For the SMT device 256, electrical connections can be provided through terminals (not shown) on the underside of the device.

In FIG. 20, an overmold structure 260 can be formed over the ceramic substrate 102 so as to substantially encapsulate the various components mounted thereon. A conformal shielding layer 104 can be formed to substantially cover the upper surface of the overmold structure 260, the side walls of the overmold structure 260, and the side walls of the ceramic substrate 102. Accordingly, the conformal shielding layer 104 can be electrically connected to one or more ground planes within the ceramic substrate 102 through the conductive features 226 to thereby provide shielding functionality.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 21:
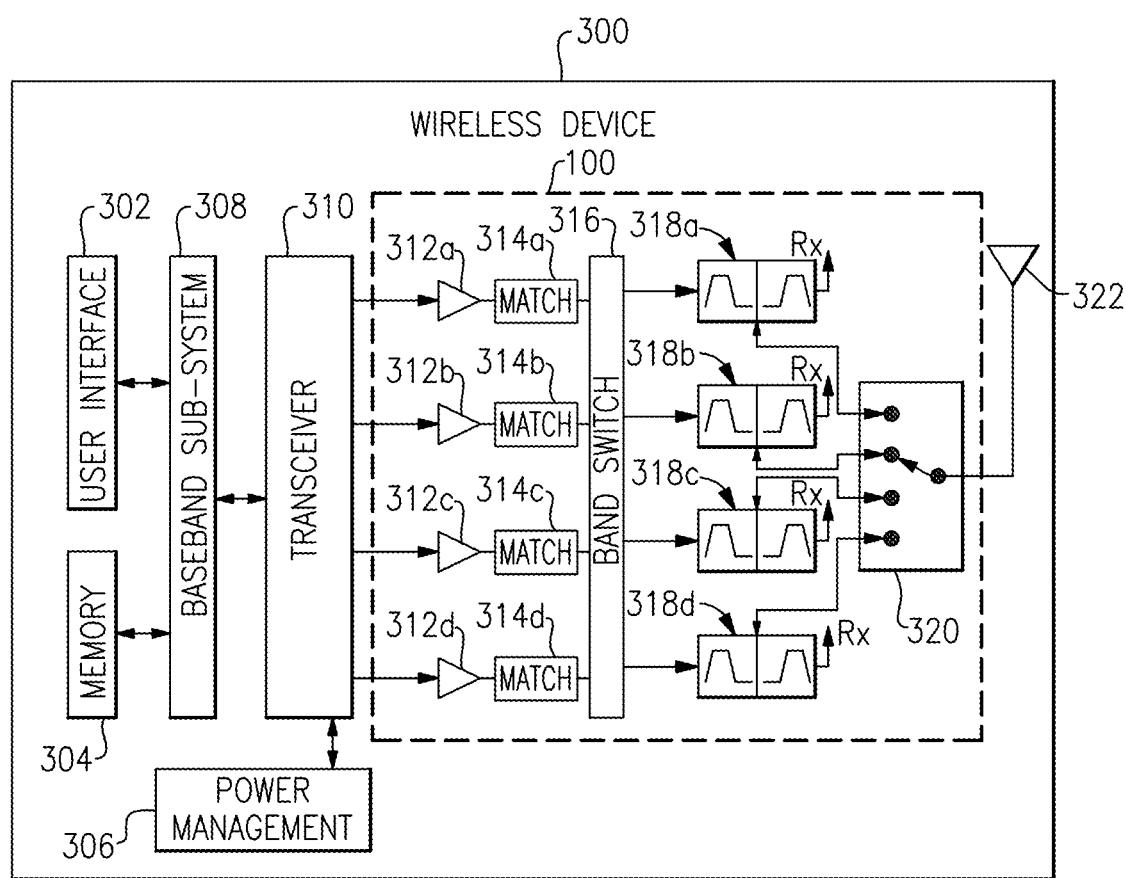
FIG. 21 depicts an example wireless device having one or more advantageous features described herein.

FIG. 21 depicts an example wireless device 300 having one or more advantageous features described herein. In the context of a module having one or more features as described herein, such a module can include some or all functionalities associated with a dashed box 100, and can be implemented as, for example, a front-end module (FEM). Other modules in the wireless device 300 can also benefit from implementation of one or more features as described herein.

PAs 312 can receive their respective RF signals from a transceiver 310 that can be configured and operated to generate RF signals to be amplified and transmitted, and to process received signals. The transceiver 310 is shown to interact with a baseband sub-system 308 that is configured to provide conversion between data and/or voice signals suitable for a user and RF signals suitable for the transceiver 310. The transceiver 310 is also shown to be connected to a power management component 306 that is configured to manage power for the operation of the wireless device. Such power management can also control operations of the baseband sub-system 308 and the module 100.

The baseband sub-system 308 is shown to be connected to a user interface 302 to facilitate various input and output of voice and/or data provided to and received from the user. The baseband sub-system 308 can also be connected to a memory 304 that is configured to store data and/or instructions to facilitate the operation of the wireless device, and/or to provide storage of information for the user.

In the example wireless device 300, outputs of the PAs 312 are shown to be matched (via respective match circuits 314) and routed to an antenna 322 through a band selection switch 316, their respective duplexers 318 and an antenna switch 320. In FIG. 21, received signals are shown to be routed to "Rx" paths (not shown) that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A ceramic assembly comprising a plurality of layers, the assembly including a boundary between a first region and a second region, the assembly further including a selected layer having a plurality of conductive features implemented on the selected layer along the boundary, each conductive feature extending into the first region and the second region such that the first region and the second region are separable through every layer of the ceramic assembly to form respective side walls, each side wall including exposed portions of the conductive features capable of forming electrical connection with a conductive shielding layer, the conductive shielding layer configured to extend along the respective side walls to make contact with every layer of the plurality of layers, the each conductive feature having a shape at or near the boundary that increases a likelihood of separation along the boundary, at least one conductive feature including two shaped vias implemented along the boundary such that a first shaped via is in the first region and a second shaped via is in the second region, the first shaped via and the second shaped via being in contact at least in part along the boundary, the first shaped via and the second shaped via including a notch along the boundary.

2. The ceramic assembly of claim 1 wherein the assembly further includes a ground plane electrically connected to the plurality of conductive features.

3. The ceramic assembly of claim 1 wherein the ceramic assembly is in an unfired state to facilitate the separation of the first region and the second region.

4. The ceramic assembly of claim 1 wherein the conductive features include a plurality of rectangular conductive vias formed on or through the selected layer such that the boundary extends generally through a middle portion of each rectangular conductive via.

5. The ceramic assembly of claim 1 wherein the conductive features include a plurality of shaped conductive vias formed on or through the selected layer, each shaped conductive via having a shape at or near the boundary that increases the likelihood of the separation occurring along the boundary.

6. The ceramic assembly of claim 1 wherein the each conductive feature is implemented on the selected layer at least in part by printing of a metal layer.

7. The ceramic assembly of claim 1 wherein the each conductive feature includes a plurality of vias, and each via of the plurality of vias includes at least one conductive material.

8. The ceramic assembly of claim 7 wherein the at least one conductive material includes silver.

* * * * *